United States Patent
Nelson et al.

(10) Patent No.: US 6,843,556 B2
(45) Date of Patent: Jan. 18, 2005

(54) SYSTEM FOR PRODUCING PATTERNED DEPOSITION FROM COMPRESSED FLUID IN A DUAL CONTROLLED DEPOSITION CHAMBER

(75) Inventors: David J. Nelson, Rochester, NY (US); Suresh Sunderrajan, Rochester, NY (US); Ramesh Jagannathan, Rochester, NY (US); Seshadri Jagannathan, Pittsford, NY (US); Glen C. Irvin, Jr., Rochester, NY (US); Sridhar Sadasivan, Rochester, NY (US); Rajesh V. Mehta, Rochester, NY (US); John E. Rueping, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 22 days.

(21) Appl. No.: 10/314,379

(22) Filed: Dec. 6, 2002

(65) Prior Publication Data
US 2004/0109049 A1 Jun. 10, 2004

(51) Int. Cl.[7] .............................. B41J 2/175; B41J 2/06
(52) U.S. Cl. ............................................ 347/85; 347/55
(58) Field of Search ................... 347/54–55, 20–21, 347/5, 95, 100–101

(56) References Cited

U.S. PATENT DOCUMENTS

| 4,013,502 A | 3/1977 | Staples ........................ 427/595 |
|---|---|---|
| 4,218,532 A | 8/1980 | Dunkleberger ............... 430/314 |
| 4,582,731 A | 4/1986 | Smith .......................... 427/421 |
| 4,734,227 A | 3/1988 | Smith ........................... 264/13 |
| 4,737,384 A | 4/1988 | Murthy et al. ............... 427/369 |
| 5,545,307 A | 8/1996 | Doss et al. .................. 205/122 |
| 6,340,216 B1 * | 1/2002 | Peeters et al. ................ 347/21 |
| 6,471,327 B2 * | 10/2002 | Jagannathan et al. ......... 347/21 |
| 6,595,630 B2 * | 7/2003 | Jagannathan et al. ......... 347/85 |
| 6,692,094 B1 * | 2/2004 | Cok .............................. 347/5 |
| 2002/0118245 A1 | 8/2002 | Jagannathan et al. ......... 347/21 |

OTHER PUBLICATIONS

U.S. Appl. No. 10/033,458, Irvin, Jr. filed Dec. 27, 2001.

Ivor Brodie and Julius J. Muray, "The Physics of Micro/Nano–Fabrication" Plenum Press, New York, 1992.

* cited by examiner

*Primary Examiner*—K. Feggins
(74) *Attorney, Agent, or Firm*—Clyde E. Bailey, Sr.

(57) ABSTRACT

A system (10) produces patterned deposition on a substrate (14) from compressed fluids. A delivery system (12) cooperates with an independently controlled first chamber and an independently controlled second chamber retaining a substrate (14) for receiving precipitated functional material along a fluid flow delivery (13) from the delivery system (12). A shadow mask (22) is arranged in close proximity to the substrate (14) for forming the patterned deposition on the substrate (14).

40 Claims, 6 Drawing Sheets

SYSTEM FOR PRODUCING PATTERNED DEPOSITION FROM COMPRESSED FLUID IN A DUAL CONTROLLED DEPOSITION CHAMBER

FIELD OF THE INVENTION

This invention relates generally to deposition from compressed fluids and, more particularly, to patterned deposition from compressed fluids onto suitable substrates with the use of masks.

BACKGROUND OF THE INVENTION

Processes that enable patterned deposition of materials onto a substrate have a number of applications, especially in the electronic microcircuit industry. Microfabrication of electronic circuits relies on the ability to create multi-layer patterns of numerous functional materials, with varying electrical properties. The technologies used for creating these multi-layer patterns may be additive, subtractive, or a combination of the two. Additive technologies deposit the functional material on the substrate in the desired pattern, i.e., the pattern is generated directly on the substrate during the deposition/layering process. Subtractive processes, on the other hand, first create a continuous layer of the functional material on the substrate. The desired pattern is then subsequently created by the selective removal of functional material from the deposited layer, i.e., the pattern is created subsequent to the deposition/layering process. A detailed description of various patterned deposition/layering processes used in the microfabrication industry may be found in "The Physics of Micro/Nano-Fabrication" by Ivor Brodie and Julius J. Murray, Plenum Press, N.Y., 1992.

Traditional micro-fabrication processes utilize either or both the additive and subtractive processes depending upon the specific application, and are generally carried out in a high vacuum (low-pressure) environment. The high vacuum process generally involves the evaporation of functional material by heating or by ion bombardment followed by deposition onto the substrate by condensation or by a chemical reaction. In these deposition processes, the functional material is required to be thermally stable or to have a thermally stable precursor that can generate the functional material on the substrate by a chemical reaction. As skilled artisans will appreciate, these processes are not useful in generating patterned layers of thermally unstable materials.

Further, those skilled in the art will appreciate that it is common to use a mask technique for patterned deposition. Typically, the mask employed for patterning on a planar substrate surface is a photoresist material. However, when the surface is nonplanar, difficulties can be encountered in depositing and cleaning off the photoresist material, necessitating the use of shadow masks or stencils. For example, U.S. Pat. No. 4,218,532 titled "Photolithographic Technique For Depositing Thin Films," issued Aug. 19, 1980 to Dunkleberger discloses a method for patterned deposition of thin films of metals, such as lead alloys, by vacuum evaporation onto a substrate through openings in a mask fabricated with a predetermined pattern. A shortcoming of this development is that it cannot be used for the patterned deposition of thermally unstable materials since these are not suitable for vacuum evaporation.

In U.S. Pat. No. 4,013,502 titled "Stencil Process For High Resolution Pattern Replication," issued Mar. 22, 1977 to Staples, a process for obtaining high-resolution pattern replication using stencils is disclosed. The stencil in Staples is a mask effecting molecular beam deposition of thin films onto a substrate through openings in the stencil. In this deposition process, the molecular beam source is an electron-beam evaporator. Much like the Dunkleberger development, a shortcoming of Staples' technology is that it cannot be used for patterned deposition of thermally unstable materials that are not suitable for evaporation using an electron beam evaporator.

Furthermore, it is well known that patterned deposition of thermally unstable materials on substrates may be achieved by liquid phase processes such as electroplating, electrophoresis, sedimentation, or spin coating but these processes are system specific. For example, in the case of electroplating, it is necessary that an electrochemically active solution of the functional material precursor is available. In the case of sedimentation and spin coating, a stable colloidal dispersion is necessary. In the case of electrophoresis, it is also necessary that the stable colloidal dispersion be charged. Microfabrication of multi-layer structures usually requires multiple stages, necessitating the complete removal of residual liquids/solvents at the end of every stage, which can be very energy, time, and cost intensive. Further, many of these liquid-based processes require the use of non-aqueous liquids/solvents; which are hazardous to health and the disposal of which can be prohibitively expensive. For example, in U.S. Pat. No. 5,545,307 titled "Process For Patterned Electroplating," issued Aug. 13, 1996 to Doss et al., a process is disclosed for patterned electroplating of metals onto a substrate 14 through a mask. The Doss et al. process, however, has at least two major shortcomings. First, it is only applicable to materials that have electrochemically active precursors. Second, it uses an aqueous electroplating bath for the process that requires the coated substrate be cleaned and then dried at the end of the coating process.

Moreover, it is well known that to eliminate the need for potentially harmful solvents that need drying, it is possible to use environmental and health-benign supercritical fluids such as carbon dioxide as solvents. For example, in U.S. Pat. No. 4,737,384 titled "Deposition Of Thin Films Using Supercritical Fluids," issued Apr. 12, 1988 to Murthy et al., a process is disclosed for depositing thin films of materials that are soluble in supercritical fluids onto a substrate. Murthy et al. include the steps of exposing a substrate at supercritical temperatures and pressures to a solution comprising a metal or polymer dissolved in water or a non-polar organic solvent. The metal or polymer is substantially insoluble in the solvent under sub-critical conditions and is substantially soluble in the solvent under supercritical conditions. Reducing the pressure alone, or temperature and pressure together, to sub-critical values cause the deposition of a thin coating of the metal or polymer onto the substrate. Nonetheless, a shortcoming of the process of Murthy et al. is its limited applicability to materials that can be dissolved in compressed fluids, severely limiting the choice of materials that can be deposited on a substrate using this technology. Another shortcoming of the process of Murthy et al. is that it does not teach a process for the patterned deposition of functional materials.

In U.S. Pat. No. 4,582,731 titled "Supercritical Fluid Molecular Spray Film Deposition and Powder Formation," issued Apr. 15, 1986 to Smith, and U.S. Pat. No. 4,734,227 titled "Method Of Making Supercritical Fluid Molecular Spray Films, Powder And Fibers," issued Mar. 29, 1988 to Smith, independent processes are disclosed for producing solid films on a substrate by dissolving a solid material into supercritical fluid solution at an elevated pressure. In both cases, the supercritical fluid solution is then rapidly expanded in a region of relatively low pressure through a heated nozzle having a relatively short orifice. Both of the aforementioned Smith processes have similar shortcomings to those indicated above, i.e., they are only applicable to materials that are soluble in compressed fluids and do not teach a process for patterned deposition.

Therefore, a need persists in the art for a patterned deposition system that permits the patterned deposition of thermally unstable/labile materials and that eliminates the use of expensive and both environmentally and human health-hazardous solvents. A further need exists for a patterned deposition system that eliminates the need for post-deposition drying for solvent-elimination. Moreover, there is an additional need for a patterned deposition technique that is applicable for a wide range of functional materials and that is not limited by specific properties of the functional materials.

SUMMARY OF THE INVENTION

It is, therefore, an object of the invention to provide a coating deposition system that permits the patterned deposition of thermally unstable/labile materials.

Another object of the invention is to provide a coating deposition system that eliminates the need for post-deposition drying for solvent elimination.

Yet another object of the invention is to provide a coating deposition system that is applicable for a wide range of functional materials.

To achieve these and other objects and advantages of the invention, there is provided, in one aspect of the invention, a system for producing patterned deposition from compressed fluid. The system includes a means for delivering a functional material that is dissolved and/or dispersed in a compressed fluid and then precipitating the functional material by decompressing the compressed fluid to a state where the functional material is no longer soluble and/or dispersible in the compressed fluid. A controlled environment retains a substrate bearing a shadow mask. The controlled environment exposes the substrate bearing the shadow mask to receive precipitated functional material as a patterned deposition on the substrate.

There are numerous advantageous effects of the present invention over prior developments. More particularly, the present system has the ability to deposit thermally unstable/labile materials and is useful for a wider range of materials unlike prior art developments. Further, the present system is considerably more efficient and controllable than existing systems. Moreover, the present invention eliminates the need for harmful and expensive materials used for drying.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

Figure 1:
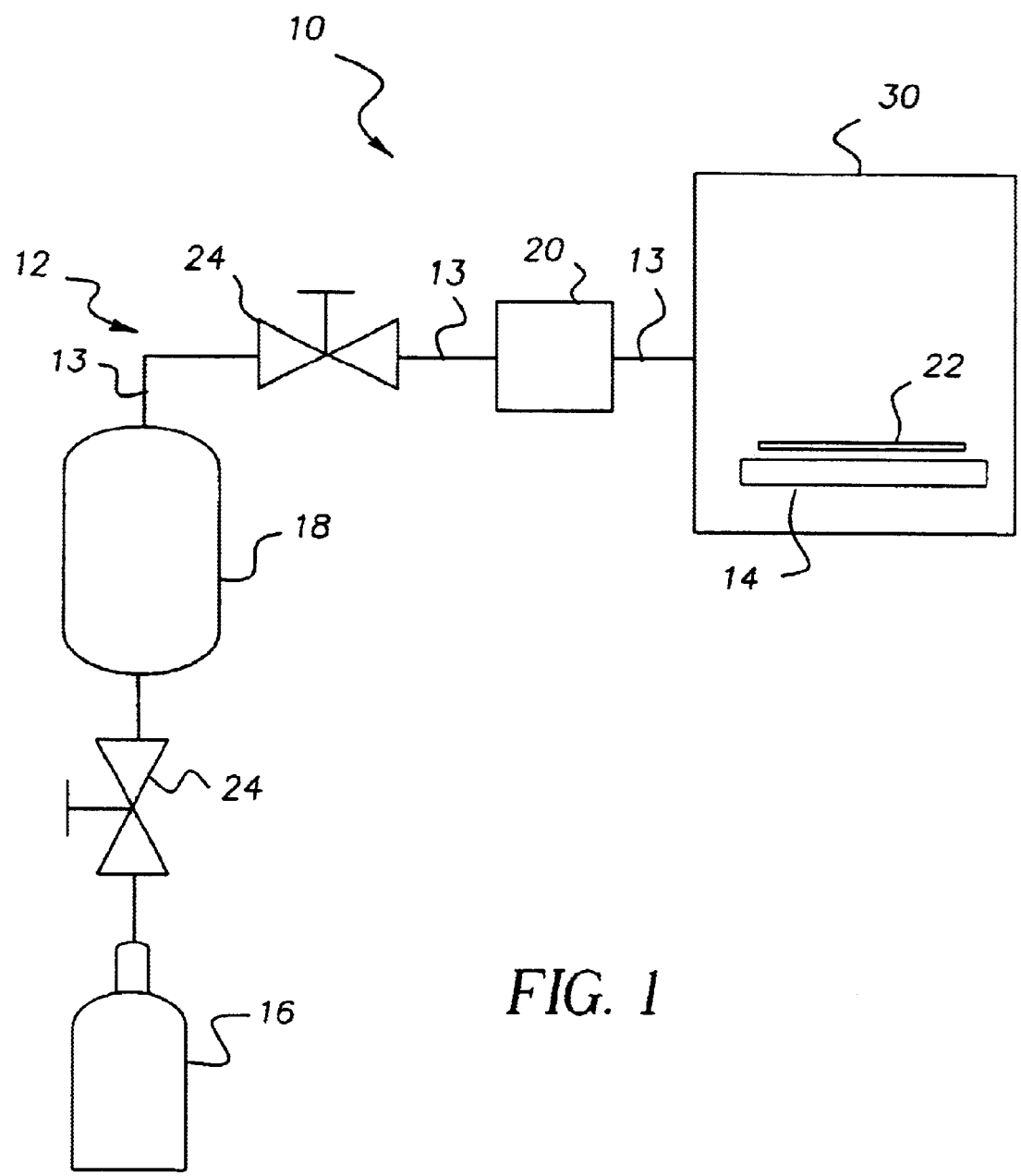
FIG. 1 is a schematic view of a preferred embodiment made in accordance with the present invention.

Turning now to the drawings, and more particularly to FIG. 1, system 10, broadly defined, for producing patterned deposition from compressed fluids includes a delivery system 12, a deposition chamber, or alternatively controlled environment, 30, and a substrate 14 retained in the deposition chamber, or alternatively, controlled environment 30. Controlled environment 30 is more typically a deposition chamber, as described in detail below. A typical delivery system 12 contemplated by the invention is one disclosed, for instance, in commonly assigned in U.S. Patent Application Publication No. 2002/0118245A1 titled "Apparatus And Method Of Delivering A Focused Beam Of A Thermodynamically Stable/Metastable Mixture Of A Function Material In A Dense Fluid Onto A Receiver," by Ramesh Jagannathan, published Aug. 29, 2002, hereby incorporated herein by reference. Each of the disclosed delivery systems is capable of delivering a precipitate functional material (as described below) and can be used in the invention.

Referring to FIG. 1, delivery system 12, capable of delivering fluids along fluid delivery path 13 in a compressed state, generally includes a source 16 of compressed fluid, a formulation reservoir 18 for containing a formulation material, a discharge assembly 20, each being described in detail in the above U.S. Patent Applications. Delivery system 12 serves several important functions in the invention. It enables the dissolution and/or dispersal of a selected material into a compressed fluid with density greater than 0.1 g/cc$^3$. Further, a solution and/or dispersion of an appropriate functional material or combination of functional materials in the chosen compressed fluid is produced in delivery system 12. Moreover, delivery system 12 delivers the functional materials as a beam or spray into a deposition chamber 30 in a controlled manner. In this context, the chosen materials taken to a compressed fluid state with a density greater than 0.1 g/cc$^3$ are gases at ambient pressure and temperature. Ambient conditions are preferably defined as temperature in the range from $-100$ to $+100°$ C., and pressure in the range from $1\times10^{-8}-100$ atm for this application.

Figure 2:
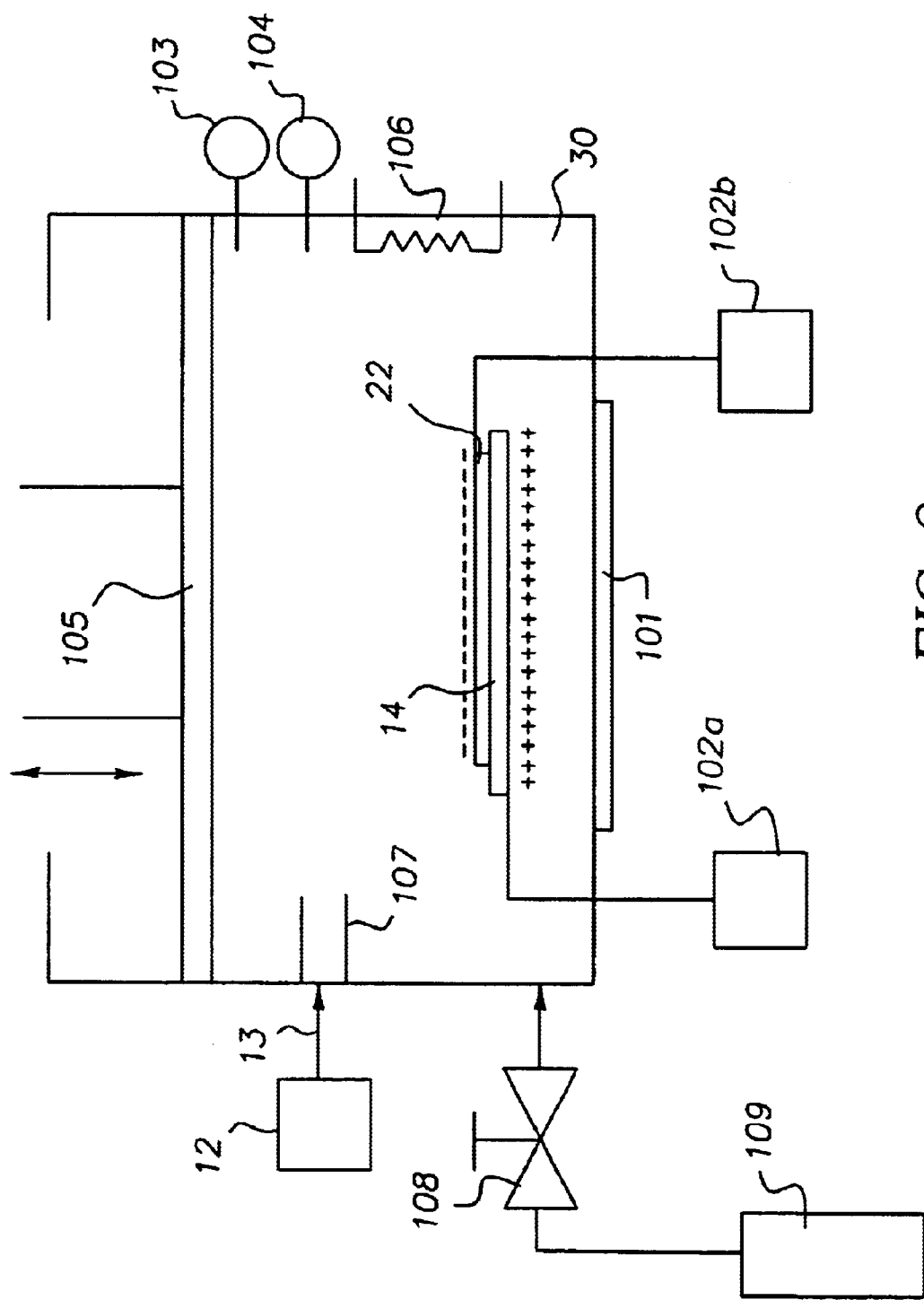
FIG. 2 is enlarged schematic view of a controlled environment in one embodiment of the invention.

As depicted in FIG. 1, controlled environment 30, such as a deposition chamber, is arranged proximate to delivery system 12. Controlled environment 30 is positioned at one end of the fluid delivery path 13 and adjacent the discharge assembly 20 of delivery system 12. As illustrated in FIG. 2, substrate 14 to be patterned with deposition material and is suitably arranged within deposition chamber 30. In close proximity to substrate 14, a mask 22 is preferably used (but not required) to control the location of the deposited functional material on the substrate 14.

Figure 3:
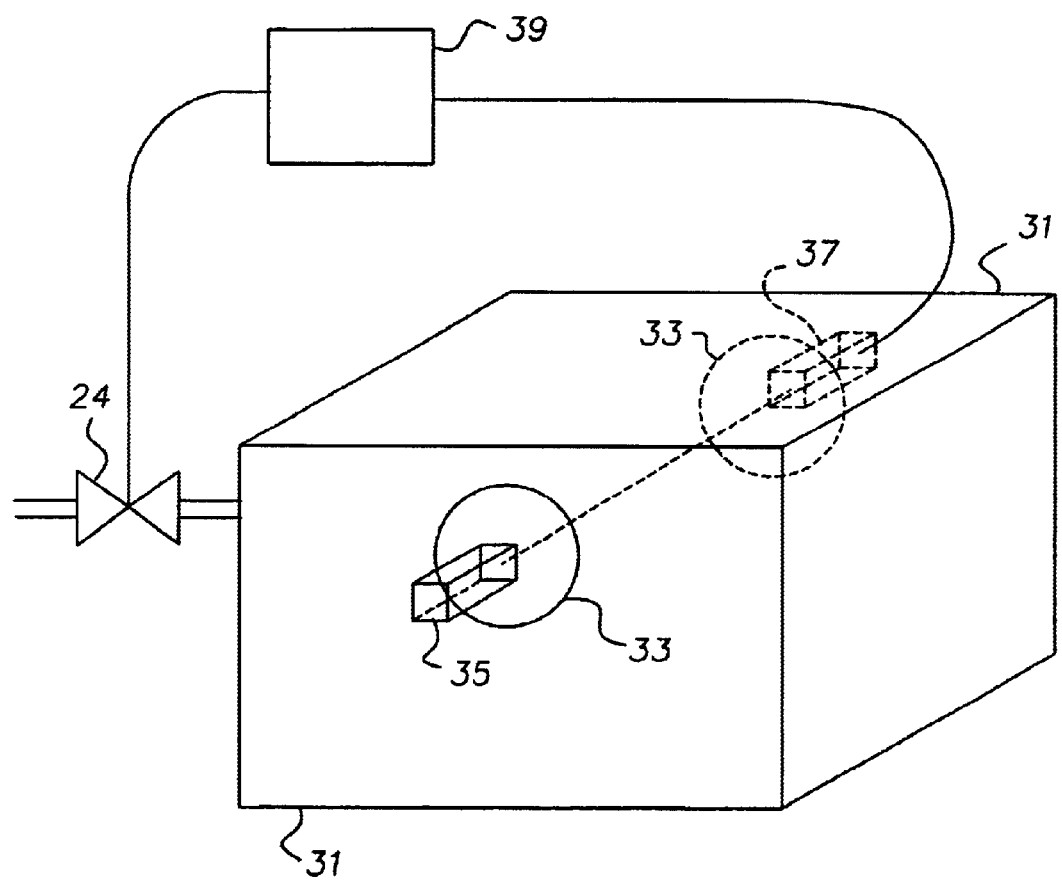
FIG. 3 is a schematic view of an alternative embodiment of an enclosure of the invention

Referring to FIG. 3, in many applications, it is desirable to maintain an exact concentration of functional material within the controlled enclosure 31. Whilst open loop systems relying on valve opening times can be used, for greater precision and reliability it is desirable to use a system such as the one illustrated in FIG. 3. According to FIG. 3, enclosure 31 (applies to enclosures of FIGS. 2, 5 and 6) is fitted with at least one viewing window or port 33. Viewing window 33 can be used alone to provide a visual indication of the conditions inside the enclosure 31. On the other hand, a viewing window 33 is also required to facilitate the use of optical emitters 35 and optical detectors 37 for the purpose of a more accurate assessment of the concentration of functional material inside the enclosure 31. The optical emitter 35 emits a beam of light that travels across the inside of the enclosure 31 and is detected by optical detector 37. This optical detector 37 sends an electrical signal to the microprocessor 39 in proportion to the amount of light received (which is a function of the amount of functional material inside the controlled enclosure 31). This information can be used in many ways, most simply as a check of the process, but also as an input to a closed loop control of the input valve 24. For example, if the concentration in the controlled enclosure 31 is low, the valve 24 is opened allowing more functional material to enter the controlled enclosure 31. This method relies on the cleanliness of the viewing windows 33 to be effective, and therefore either by routine maintenance, calibration, or the application of a like charge as the particles to the viewing windows 33, the viewing windows 33 themselves must be kept free of debris. Skilled artisans will appreciate that there are many variations and other detection methods that could be applied to a closed loop concentration monitoring and control method described above. For example, in an optical detection scheme, the optical emitter 35 and optical detector 37 could be on the same side of the controlled enclosure 31 relying on a reflective surface on the opposite side to reflect the beam. The scope is not limited to optical detection, any method that provides an indication of the amount of functional material such as electrical properties, physical properties, or chemical properties could be used.

Referring back to FIG. 1, a compressed fluid carrier contained in the source 16 of compressed fluid is any material that dissolves/solubilizes/disperses a functional material. Source 16 of compressed fluids, containing compressed fluid delivers the compressed fluid carrier at predetermined conditions of pressure, temperature, and flow rate as a compressed fluid. Compressed fluids are defined in the context of this application as those fluids that have a density of greater than 0.1 grams per cubic centimeter in the defined range of temperature and pressure of the formulation reservoir, and are gases at ambient temperature and pressure. Materials in their compressed fluid state that exist as gases at ambient conditions find application here because of their unique ability to solubilize and/or disperse functional materials of interest in the compressed fluid state, and precipitate the functional material under ambient conditions.

Fluids of interest that may be used to transport the functional material include but are not limited to carbon dioxide, nitrous oxide, ammonia, xenon, ethane, ethylene, propane, propylene, butane, isobutane, chlorotrifluoromethane, monofluoromethane, sulphur hexafluoride, and mixtures thereof. Due to environmental compatibility, low toxicity, low cost, wide availability, and non-flammability, carbon dioxide is generally preferred.

Referring again to FIG. 1, formulation reservoir 18 is utilized to dissolve and/or disperse functional materials in compressed liquids or compressed fluids with or without cosolvents and/or dispersants and/or surfactants, at desired formulation conditions of temperature, pressure, volume, and concentration. The formulation may include additives to modify surface tension for charging and wetting viscosity through the use of rheology modifiers and/or thickeners, stabilizers, binders, and dopants. Functional materials may be any material that needs to be delivered to a substrate 14, for example electroluminescent molecules, imaging dyes, nanoparticles, polymers etc.

In addition, the formulation reservoir 18 can include a source that electrically charges the material particles prior to the material being ejected from the discharge assembly 20. Charging the particles is an important step in many of the preferred embodiments. Alternatively, the marking materials can also be chosen such that the marking material stream becomes charged as it is ejected from the discharge assembly 20 and does not need additional charging. Additionally, additives that can promote charging of the marking materials can also be chosen such that the marking material stream becomes charged as it is ejected from the discharge assembly 20. Such additives may include surfactants such as those disclosed in U.S. patent application Ser. No. 10/033,458 filed Dec. 27, 2001, titled "A Compressed Fluid Formulation" by Glen C. Irvin, Jr., et al.

Further, formulation reservoir 18 can be made out of any suitable materials that can withstand the formulation conditions. An operating range from 0.001 atmospheres (1.013× $10^2$ Pa) to 1000 atmospheres (1.013×$10^8$ Pa) in pressure and from −25° Centigrade to 1000° Centigrade is preferred. Typically, the preferred materials of construction include various grades of high pressure stainless steel. However, the material of choice is determined by temperature and pressure range of operation.

Formulation reservoir 18 should be precisely controlled with respect to the operating conditions, i.e., pressure, temperature, and volume. The solubility/dispersability of functional materials depends upon the conditions within the formulation reservoir 18 and even small changes in the operating conditions within the formulation reservoir 18 can have undesired effects on functional material solubility/dispersability.

Any suitable surfactant and dispersant material that is capable of solubilizing/dispersing the functional materials in the compressed liquid for the required application can be used in this method. Such materials include but are not limited to fluorinated polymers such as perfluoropolyether and silane and siloxane compounds.

Figure 4:
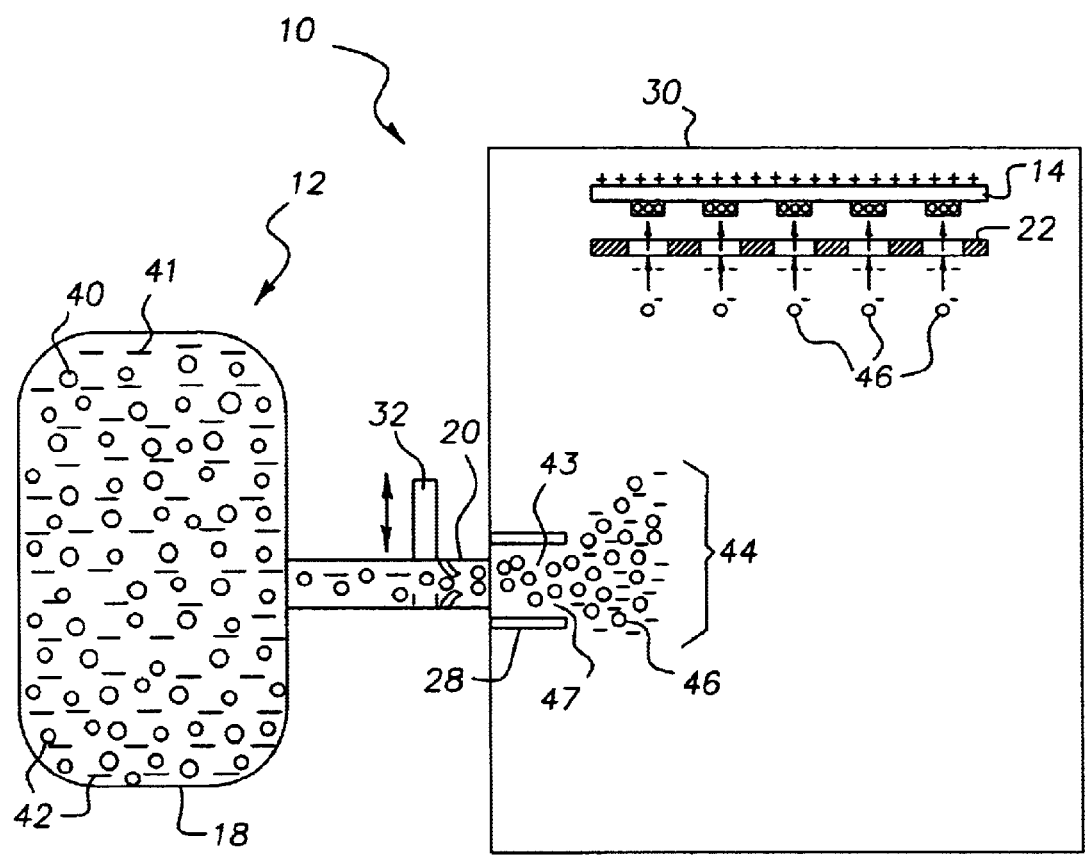
FIG. 4 is a diagram schematically representing the operation of the present invention.

Referring to FIGS. 1 and 4, delivery system 12 is shown in fluid communication through orifices/nozzles 28 with enclosed, controlled environment 30 that contains substrate 14 and mask 22. According to FIG. 1, valve 24 may be designed to actuate with a specific frequency or for a fixed time period so as to permit the controlled release of formulation from formulation reservoir 18 into enclosed environment 30 via orifices/nozzles 28. According to FIG. 4, the controlled release of functional material 40 into enclosed environment 30 results in the evaporation of the compressed fluid 41 and the precipitation and/or aggregation of the dissolved and/or dispersed functional material 40. The precipitated/aggregated functional material may be allowed to gravity-settle or may be settled using an electric, electrostatic, electromagnetic, or magnetic assist. Mask 22 in close proximity to substrate 14 results in the patterned deposition of functional material 40 on the substrate 14.

Substrate 14 may be any solid including an organic, an inorganic, a metallo-organic, a metallic, an alloy, a ceramic, a synthetic and/or natural polymeric, a gel, a glass, and a composite material. Substrate 14 may be porous or nonporous. Additionally, the substrate 14 can have more than one layer. Additionally, the substrate 14 may be flexible or rigid.

As best illustrated in FIGS. 2 and 4, mask 22 may be physical (separate) or integral. The purpose of the mask 22 is to provide a pattern for the deposition of functional solute material. Those skilled in the art will appreciate that mask design and manufacture is well established. Physical masks require direct contact between mask 22 and substrate 14.

Their advantage is that they are relatively inexpensive and can be re-used for multiple substrates 14. However, if the substrate 14 is delicate, the physical contact may damage the substrate 14. Precise alignment is also difficult. Integral masks 22 are structures formed on the substrate 14 prior to coating/deposition. Alignment and spacing is easier because the mask 22 is a part of the substrate 14. However, because of the potential need to remove the mask 22 after deposition, a subsequent etching step may be necessary, potentially making this more expensive and time-consuming.

Referring to FIG. 4, nozzle 28 directs the flow of the functional material 40 from formulation reservoir 18 via delivery system 12 into enclosed environment 30. Nozzle 28 is also used to attenuate the final velocity with which the functional material 40 enters the enclosed environment 30. In our preferred application, it is desirable to rapidly spread the stream of precipitated functional material 40 using a divergent nozzle geometry. Skilled artisans will however appreciate that nozzle geometry can vary depending on a particular application, as described in U.S. Patent Application Publication No. 2002/0118245A1, incorporated herein by reference.

In Operations

Operation of system 10 will now be described. FIG. 4 is a diagram schematically representing the operation of delivery system 10 and should not be considered as limiting the scope of the invention in any manner. The description below uses a single nozzle 28 although multiple nozzles and/or multiple nozzle shapes and/or multiple delivery devices and shapes are within the contemplation of the invention. (See for instance other nozzle exemplars disclosed in U.S. Patent Application Publication No. 2002/0118245A1.

Referring to FIG. 4, a formulation 42 of functional material 40 in a compressed liquid 41 is prepared in the formulation reservoir 18 of the invention. Functional material 40, which may be any material of interest in solid or liquid phase, can be dispersed (as shown in FIG. 4) and/or dissolved in a supercritical fluid and/or compressed liquid 41 making a mixture or formulation 42. Functional material 40 may have various shapes and sizes depending on the type of the functional material 40 used in the formulation.

According to FIG. 4, the supercritical fluid and/or compressed liquid 41 form a continuous phase and functional material 40 forms a dispersed and/or dissolved single phase. The formulation 42 (i.e., the functional material 40 and the supercritical fluid and/or compressed liquid 41) is maintained at a suitable temperature and a suitable pressure for the functional material 40 and the supercritical fluid and/or compressed liquid 41 used in a particular application. The shutter 32 is actuated to enable the ejection of a controlled quantity of the formulation 42.

With reference to FIGS. 1 and 4, functional material 40 is controllably introduced into the formulation reservoir 18. The compressed fluid 41 is also controllably introduced into the formulation reservoir 18. The contents of the formulation reservoir 18 are suitably mixed using a mixing device (not shown) to ensure intimate contact between the functional material 40 and compressed fluid 41. As the mixing process proceeds, functional material 40 is dissolved and/or dispersed within the compressed fluid 41. The process of dissolution/dispersion, including the amount of functional material 40 and the rate at which the mixing proceeds, depends upon the functional material 40 itself, the particle size and particle size distribution of the functional material 40 (if the functional material 40 is a solid), the compressed fluid 41 used, the temperature, and the pressure within the formulation reservoir 18. When the mixing process is complete, the mixture or formulation 42 of functional material and compressed fluid is thermodynamically stable/metastable in that the functional material is dissolved or dispersed within the compressed fluid in such a fashion as to be indefinitely contained in the same state as long as the temperature and pressure within the formulation reservoir 18 are maintained constant or in the same state for the period of the efficient operation of the process (metastable). This thermodynamically stable state is distinguished from other physical mixtures in that there is no settling, precipitation, and/or agglomeration of functional material particles within the formulation reservoir 18 unless the thermodynamic conditions of temperature and pressure within the formulation reservoir 18 are changed. As such, the functional material 40 and compressed fluid 41 mixtures or formulations 42 of the present invention are said to be thermodynamically stable.

The functional material 40 can be a solid or a liquid. Additionally, the functional material 40 can be an organic molecule, a polymer molecule, a metallo-organic molecule, an inorganic molecule, an organic nanoparticle, a polymer nanoparticle, a metallo-organic nanoparticle, an inorganic nanoparticle, an organic microparticle, a polymer microparticle, a metallo-organic microparticle, an inorganic microparticle, and/or composites of these materials, etc. After suitable mixing with the compressed fluid 41 within the formulation reservoir 18, the functional material 40 is uniformly distributed within a thermodynamically stable/metastable mixture, that can be a solution or a dispersion, with the compressed fluid 41. This thermodynamically stable/metastable mixture or formulation 42 is controllably released from the formulation reservoir 18 through the discharge assembly 20.

Referring again to FIG. 4, during the discharge process, the functional material 40 is precipitated from the compressed fluid 41 as the temperature and/or pressure conditions change. The precipitated functional material 44 is ejected into the deposition chamber or controlled environment 30 by the discharge assembly 20. The particle size of the functional material 40 ejected into the chamber 30 and subsequently deposited on the substrate 14 is typically in the range from 1 nanometer to 1000 nanometers. The particle size distribution may be controlled to be more uniform by controlling the formulation (functional solute materials and their concentrations) rate of change of temperature and/or pressure in the discharge assembly 20, and the ambient conditions inside the controlled environment 30.

Although not specifically shown, delivery system 12 (FIG. 4), contemplated by the invention, is also designed to appropriately change the temperature and pressure of the formulation 42 to permit a controlled precipitation and/or aggregation of the functional material 40 (see for instance U.S. Patent Application Publication No. 2002/0118245A1). As the pressure is typically stepped down in stages, the formulation 42 fluid flow is self-energized. Subsequent changes to the conditions of formulation 42, for instance, a change in pressure, a change in temperature, etc., result in the precipitation and/or aggregation of the functional material 40 coupled with an evaporation of the compressed fluid 41. The resulting precipitated and/or aggregated functional material 44 deposits on the substrate 14 evenly. According to FIG. 4, evaporation of the compressed fluid 41 can occur in a region located outside of the discharge assembly 20 within deposition chamber 30. Alternatively, evaporation of the compressed fluid 41 can begin within the discharge assembly 20 and continue in the region located outside the discharge assembly 20 but within deposition chamber 30. Alternatively, evaporation can occur within the discharge assembly 20.

According to FIG. 4, a stream 43 of the functional material 40 and the compressed fluid 41 is formed as the formulation 42 moves through the discharge assembly 20. When the size of the stream 43 of precipitated and/or aggregated functional material 44 is substantially equal to an exit diameter of the nozzle 28 of the discharge assembly 20, the stream 43 of precipitated and/or aggregated functional material 44 has been collimated by the nozzle 28. When the size of the stream 43 of precipitated and/or aggregated functional material 44 is less than the exit diameter of the nozzle 28 of the discharge assembly 20, the stream 43 of precipitated and/or aggregated functional material 44 has been focused by the nozzle 28. It may be desirable for a deposition chamber input to be a diverging bean to quickly spread the precipitated and/or aggregated functional material 44 and dissipate its kinetic energy. Such an input is possible without a nozzle 28.

Referring again to FIGS. 2, 4 & 5, substrate 14 resides within deposition chamber 30 such that the stream 43 of precipitated and/or aggregated functional material stream 44 is deposited onto the substrate 14. The distance of the substrate 14 from the discharge assembly 20 is chosen such that the compressed fluid 41 evaporates prior to reaching the substrate 14. Hence, there is no need for subsequent substrate 14 drying processes. Further, subsequent to the ejection of the formulation 42 from the nozzle 28 and the precipitation of the functional material 44, additional focusing and/or collimation may be achieved using external devices such as electromagnetic fields, mechanical shields, magnetic lenses, electrostatic lenses, etc. Alternatively, the substrate 14 can be electrically or electrostatically charged such that the position of the functional material 40 can be controlled.

Referring again to FIG. 4, it is also desirable to control the velocity with which individual particles 46 of functional material 40 are ejected from the nozzle 28. Since there may be a sizable pressure drop from within the delivery system 10 to the operating environment, the pressure differential converts the potential energy of the delivery system 10 into kinetic energy that propels the functional material particles 46 onto the substrate 14. The velocity of these particles 46 can be controlled by suitable nozzle design (see discussion above) and by controlling the rate of change of operating pressure and temperature within the system. Further, subsequent to the ejection of the formulation 42 from nozzle 28 and the precipitation of the functional material 40, additional velocity regulation of the functional material 40 may be achieved using external devices such as electro-magnetic fields, mechanical shields, magnetic lenses, electrostatic lenses, etc. The nozzle design will depend upon the particular application addressed. (See, for instance, U.S. Patent Application Publication No. 2002/0118245A1).

Moreover, the temperature of nozzle 28 may also be controlled. Referring to FIG. 4, the temperature of nozzle 28 may be controlled as required by specific applications to ensure that the nozzle opening 47 maintains the desired fluid flow characteristics. Nozzle temperature can be controlled through the nozzle heating module (not shown) using a water jacket, electrical heating techniques, etc. (See, for instance, U.S. Patent Application Publication No. 2002/0118245A1). With appropriate nozzle design, the exiting stream temperature can be controlled at a desired value by enveloping the exiting stream with a co-current annular stream of a warm or cool inert gas.

Embodiment I

Referring to FIG. 2, controlled environment 30 is designed for use at extremes of pressure. Incorporated in the controlled environment 30 is a pressure modulator 105. The pressure modulator 105, as shown, resembles a piston. This is for illustration only. Skilled artisans will also appreciate that pressure modulator 105 could also be a pump or a vent used in conjunction with an additional pressure source. An example of an additional pressure source is the source 109 of compressed fluid. This source 109 is modulated with a flow control device or valve 108 to enable functional material to enter the deposition chamber 30 via a fluid delivery path 13. The pressure inside the deposition chamber 30 is carefully monitored by a pressure sensor 103 and can be set at any pressure less than that of the delivery system 12 (including levels of vacuum) to facilitate precipitation/aggregation. In addition, the deposition chamber 30 is provided with temperature sensor 104 and temperature modulator 106. Temperature modulator 106 is shown as an electric heater but could consist of any of the following (not shown): heater, a water jacket, a refrigeration coil, and a combination of temperature control devices.

Figure 6:
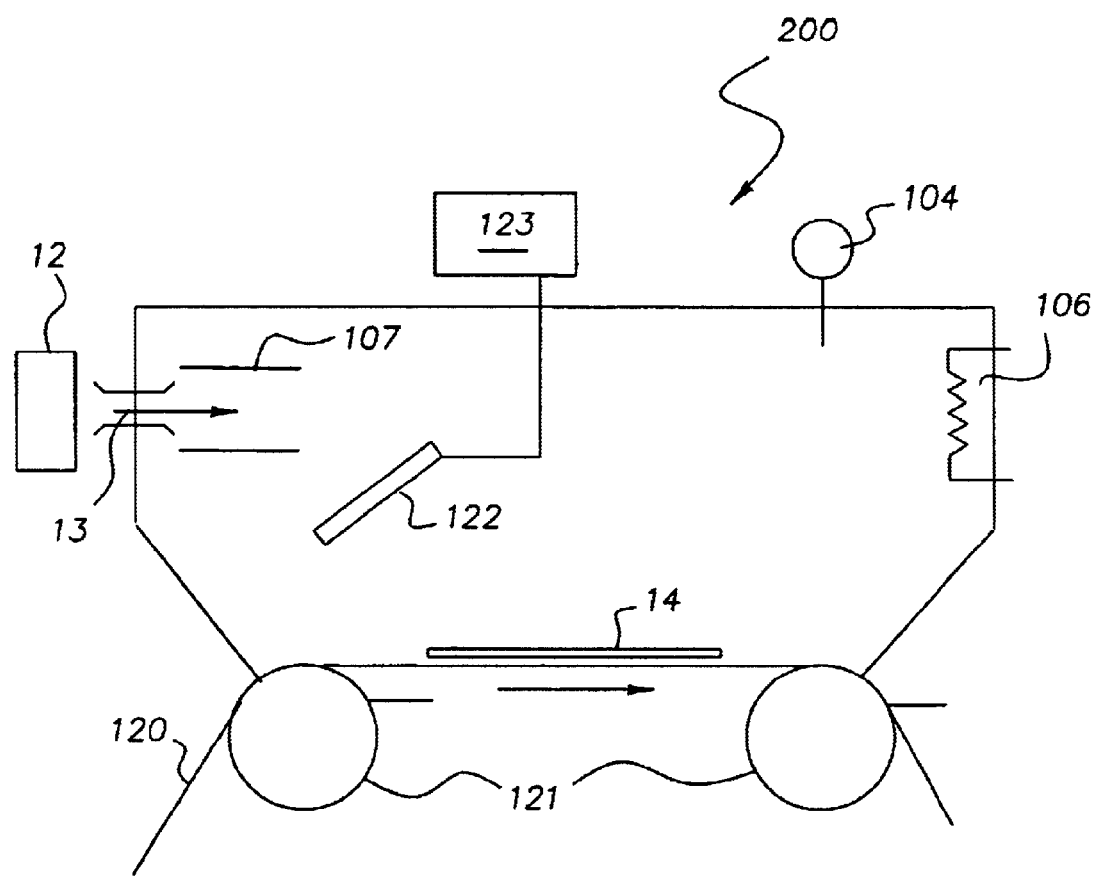

Referring to FIGS. 1, 2, and 4, deposition chamber 30 generally serves to hold the substrate 14 and the mask 22 and facilitates the deposition of the precipitated functional material 44. To enable a more complete and even distribution of the functional material 40, electric or electrostatic charges can be applied to the substrate 14 and/or mask 22. Through the ejection process in the discharge assembly 20, the particles are known to become charged. If desired, additional charge can be applied to them using a particle charging device 107 (FIG. 2). The functional material 40, now charged can be attracted or repelled from various surfaces to aid in the deposition process. According to FIG. 2, charging devices 102a, 102b are provided for both the substrate 14 and mask 22, respectively. For illustrative purposes only, a positive charge (+) is shown on substrate 14 and a negative charge (−) is shown on mask 22. The polarity may be changed to suit the application. A charge equal to that of the functional material 40 is applied to the mask 22, whereas a charge opposite of that of the functional material 40 is applied to the substrate 14 to attract the functional material. Obviously there can be no electrical conduction between the two to maintain the charge differential. This may limit the material selection of one or both, or add the requirement for an additional insulating layer (not shown). In a similar manner, it may be beneficial to create other electric or electrostatic charges on the deposition chamber 30 or on any other mechanical elements within the deposition chamber 30. As shown in FIG. 6, an internal baffle 122 may be used to provide a more even distribution of functional material 40 within the deposition chamber 200. A charge may be applied to the internal baffling by a baffle charging device 123.

Referring again to FIG. 2, deposition chamber 30 also provides easy access for the insertion and removal of the substrate 14 through access port 101. This process will potentially be automated by mechanical devices which are not shown. Access port 101 of deposition chamber 30 also provides access for the insertion and removal of the mask 22 as well as for the proper placement of the mask 22. Mask alignment relative to the substrate 14 is key to this application and may be manual or preferably, automated. Though it is shown oriented with the substrate 14 facing upwards, this is not a requirement of the invention. When attracting particles electrostatically, it may be advantageous to orient the substrate 14 facing downward. In this manner, no debris from the deposition chamber 30 could inadvertently fall onto the substrate 14.

The controlled environment can be used for post deposition processing of the deposited material on the substrate. Post deposition processing may involve the control of humidity, temperature, atmospheric conditions including pressure, and chemical composition of the atmosphere. As an example, many processes require the curing of the materials to obtain desired functionality at elevated temperature. The thermal control that is already built into the enclosure can be utilized for this purpose. Alternatively, the post processing required can be done outside the enclosure.

It should be appreciated that deposition chamber 30 should also be designed so that there are no dead volumes that may result in the accumulation of precipitated functional materials 44 and so that it may be easily cleaned. As such, it may be further partitioned into more than one sub-chamber to facilitate the above (not shown). It may also be equipped with suitable mechanical devices to aid the precipitation and deposition of functional material 40. An example of such a device would be a mechanical agitator.

Embodiment II

Figure 5:
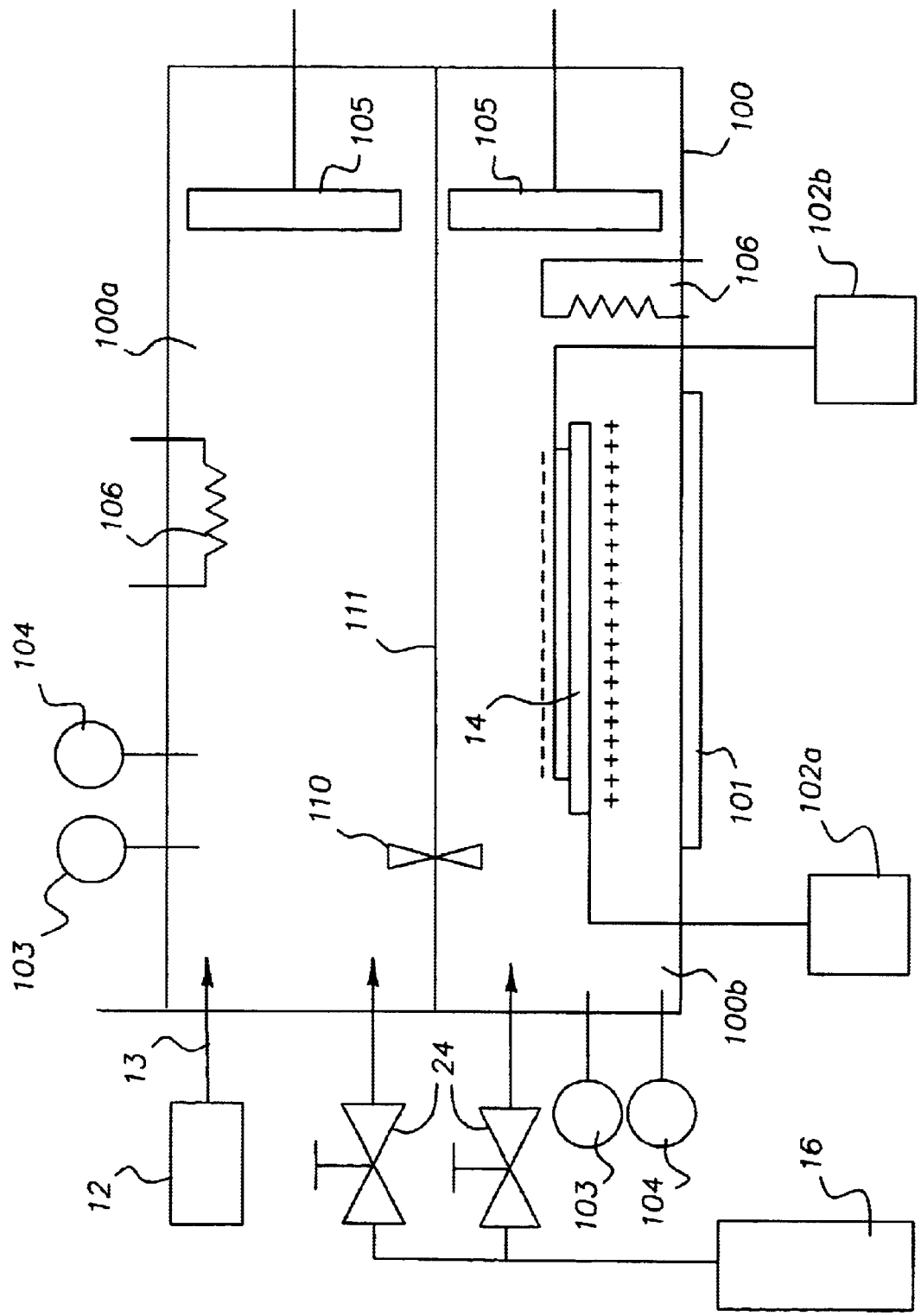
FIG. 5 is a schematic view of an alternative embodiment of a controlled environment or deposition chamber useful in the invention; and, FIG. 6 is a schematic view of an alternative embodiment of another controlled environment or deposition chamber useful in the invention.

Turning now to FIG. 5, another embodiment of deposition chamber 100, contemplated by the invention, is shown. It contains many of the same features previously described in the discussion of FIG. 2, with the addition of a medium 111 which divides the deposition chamber 100 into a preparation sub-chamber 100a and a deposition sub-chamber 100b. The materials in these sub-chambers 100a, 100b are allowed to flow through controllable dual chamber interface valve 110. Each sub-chamber 100a, 100b is configured with independent control of pressure and temperature through the use of pressure sensors 103, temperature sensors 104, pressure modulators 105, and temperature modulators 106. The preparation sub-chamber 100a differs from the formulation reservoir 18 (FIG. 1) in that the functional material 40 can be (but is not necessarily) precipitated. The addition of a preparation sub-chamber 100a to the system allows for a potentially large volume of prepared deposition material to be ready and maintained at a higher than ambient pressure while still allowing the changing of substrate 14 and deposition material through the access port 101.

Embodiment III

In FIG. 6, a simplified deposition chamber 200 is illustrated. In this embodiment, no provision is made for maintaining a pressure above that of ambient. Many of the other features described in FIGS. 2 and 5 are still possible, but by no longer requiring the deposition chamber 200 to support an elevated pressure, certain additional advantages can be realized. For example, the substrate 14 no longer is required to be contained in deposition chamber 200. This is illustrated in FIG. 6 by showing a moving substrate in the form of a web 120 that is transported by conveyors 121. In such a system, it is possible to perform continuous coating operations. In this case, a separate mask would likely not be used except for the case of a step and repeat process. Rather, a mask integral to the substrate, as previously described, is the preferred method of achieving patterned deposition. Alternatively, a similar approach, illustrated in FIGS. 2 and 5, could be used also without need for access port 101.

Additional aspects of the invention may include multiple deposition chambers 30, 100, or 200, as illustrated in FIGS. 2, 5, and 6, for coating multiple layers onto substrate 14. Alternatively, multiple masks 22 may be used such that a mask with a specific configurational structure of aperture patterns is used and subsequently replaced with another shadow mask of different configurational structure of aperture patterns on the same substrate 14. Multiple masks, indexing of a mask, multiple layers, and multiple material processes are commonly used in the manufacture of displays, therefore details and methods to provide proper registration such as through the use of optical fiducials are well known. The sequential process used for deposition of colored material(s) for display products applications may be interspersed with other processes, including deposition of other material(s) and/or post treatment of deposited material (s), as needed, to create a desired product.

It is to be understood that elements not specifically shown or described may take various forms well known to those skilled in the art. Additionally, materials identified as suitable for various facets of the invention, for example, functional materials. These are to be treated as exemplary, and are not intended to limit the scope of the invention in any manner.

Parts List 10 system
12 delivery system
13 fluid delivery path
14 substrate
16 source of compressed fluid
18 formulation reservoir
20 discharge assembly
22 mask
24 closed loop control of the input valve
28 orifices/nozzles
30 deposition chamber or controlled environment
31 enclosure
32 shutter
33 viewing window
35 optical emitter
37 optical detector
39 microprocessor
40 functional material
41 compressed fluids
42 formulation of functional material 40
43 stream of functional material 40
44 precipitated and/or aggregated functional material
46 functional material particles
47 nozzle opening
100 alternative embodiment of deposition chamber or controlled environment
100a preparation sub-chamber
100b deposition sub-chamber
101 access port
103 pressure sensor
102a charging device
102b charging device Parts List—Continued 104 temperature sensor
105 pressure modulator
106 Temperature Modulator
107 particle charging device
108 flow control valve
109 source of compressed fluids
110 interface valve
111 medium
120 web
121 conveyor 122 internal baffle
123 baffle charging device
200 another alternative embodiment of deposition chamber or controlled environment

What is claimed is:

1. A system for producing a patterned deposition of charged precipitate functional material on a substrate from a compressed fluid, comprising:

means for controllably delivering a functional material in a compressed state and then means for converting said functional material into a precipitate functional material for introduction into a controlled environment, said controlled environment includes an independently controlled first chamber and an adjoining independently controlled second chamber retaining said substrate, said independently controlled first chamber having an inlet port in fluid communication with said means for controllably delivering said functional material and an outlet port communicating with said independently controlled second chamber, and said independently controlled second chamber exposing said substrate bearing a shadow mask to said patterned deposition of charged precipitate functional material from said independently controlled first chamber.

2. The system recited in claim 1 wherein said independently controlled first chamber and said independently controlled second chamber each comprise a pressure modulator for maintaining pressure at a predetermined level.

3. The system recited in claim 2 wherein said independently controlled first chamber and said independently controlled second chamber each comprise a temperature modulator for maintaining temperature at a predetermined level.

4. The system recited in claim 3 wherein said temperature modulator comprises an electric heater.

5. The system recited in claim 3 wherein said temperature modulator comprises a water jacket in contact with a portion of said controlled environment.

6. The system recited in claim 3 wherein said temperature modulator comprises a refrigeration coil in fluid contact with a portion of said controlled environment.

7. The system recited in claim 2 wherein said pressure modulator is a piston-like element.

8. The system recited in claim 2 wherein said pressure modulator is a pump.

9. The system recited in claim 2 wherein said pressure modulator is a vent arranged in said controlled environment and a pressure control means cooperatively associated with said vent.

10. The system recited in claim 1 wherein said independently controlled first chamber and said independently controlled second chamber each comprise means for monitoring temperature and pressure levels.

11. The system recited in claim 1 wherein said substrate retained in said independently controlled first chamber is provided with an electrical charge thereby forming an electrically charged substrate to attract charged precipitate functional material from said independently controlled first chamber.

12. The system recited in claim 11 wherein said substrate comprises a material selected from the group consisting of: an organic solid material, an inorganic solid material, a metallo-organic material, a ceramic material, an alloy material, a synthetic material, a natural polymeric material, a gel material, a vitreous material, and a composite material.

13. The system recited in claim 11 wherein said electrically charged substrate has a polarity opposite that of said charged precipitate functional material.

14. The system recited in claim 1 wherein said shadow mask is provided with an electrical charge forming an electrically charged shadow mask, said electrically charged shadow mask and said charged precipitate functional material having the same polarity.

15. The system recited in claim 1 further comprising means for orienting said substrate relative to a stream of charged precipitate functional material.

16. The system recited in claim 15 wherein said substrate has an orientation relative to said stream of precipitate functional material that indirectly exposes said substrate to said stream of precipitate functional material.

17. The system recited in claim 15 wherein said substrate has an orientation relative to said stream of precipitate functional material that exposes said substrate directly to said stream of precipitate functional material.

18. The system recited in claim 1 wherein said independently controlled second chamber is provided with an access port for inserting and removing said substrate.

19. The system recited in claim 1 wherein said means for controllably delivering exposes said precipitate functional material to a pressure higher than the pressure inside said independently controlled first chamber.

20. The system recited in claim 1 wherein said independently controlled first chamber is further provided with a first electrostatic charging element for imparting a charge on said precipitate functional material.

21. The system recited in claim 20 wherein said independently controlled second chamber is further provided with a second electrostatic charging element for imparting an electrostatic charge on said substrate.

22. The system recited in claim 21 wherein said independently controlled second chamber is further provided with a third electrostatic charging element for imparting an electrostatic charge on said shadow mask.

23. The system recited in claim 1 wherein a charge applied to said substrate is applied for a predetermined duration, said predetermined duration being determinate of the amount of said precipitate functional material deposited on said substrate.

24. The system recited in claim 1 wherein said functional material comprises a material selected from the group consisting of: electroluminescent molecules, imaging dyes, ceramic nano-particles and polymeric materials.

25. The system recited in claim 1 wherein said compressed fluids comprise materials selected from the group consisting of: carbon dioxide, nitrous oxide, ammonia, xenon, ethane, ethylene, propane, propylene, butane, isobutane, chlorotrifluoromethane, monofluromethane, sulfur hexafluoride, and mixtures thereof.

26. The system recited in claim 1 wherein said enclosed environment is electrostatically charged to prevent deleterious particles from adhering thereto.

27. The system recited in claim 1 wherein said controlled second chamber contains an optical emitter that cooperates with an optical detector for determining the concentration of said precipitate functional material inside said controlled environment.

28. The system recited in claim 27 wherein said controlled environment has at least one viewing port for observing activity inside either of said independently controlled first chamber and said independently controlled second chamber.

29. The system recited in claim 28 wherein a reflective surface is arranged in said independently controlled second chamber opposite said optical emitter for reflecting energy from said optical emitter that is detected by said optical detector.

30. The system recited in claim 29 wherein said optical detector transmits an electrical signal to a microprocessor thereby generating data for future processing.

31. The system recited in claim 1 wherein said means for controllably delivering comprises a discharge assembly having a nozzle for ejecting a stream of precipitate functional material into said independently controlled first chamber.

32. The system recited in claim 31 wherein said nozzle is a divergent nozzle.

33. The system recited in claim 32 wherein said precipitate functional material is further propelled from said nozzle in the presence of an electro-magnetic field in said independently controlled first chamber.

34. The system recited in claim 32 wherein said precipitate functional material is further propelled from said nozzle in the presence of at least one mechanical shield arranged in said independently controlled first chamber.

35. The system recited in claim 32 wherein said precipitate functional material is further propelled from said nozzle in the presence of at least one magnetic lens arranged in said independently controlled first chamber.

36. The system recited in claim 32 wherein said precipitate functional material is further propelled from said nozzle in the presence of at least one electrostatic lens arranged in said independently controlled first chamber.

37. The system recited in claim 32 wherein said nozzle is provided with a heating means to promote a predetermined fluid flow rate.

38. The system recited in claim 1 wherein said substrate and said means for controllably delivering are spaced apart by a predetermined distance that enables said compressed fluid to evaporate from a liquid or compressed phase to a gas phase prior to depositing on said substrate.

39. The system recited in claim 1 wherein said functional material is dissolved in said compressed state.

40. The system recited in claim 1 wherein said functional material is dispersed in said compressed state.

* * * * *